US008593617B2

(12) United States Patent
Van Herpen et al.

(10) Patent No.: US 8,593,617 B2
(45) Date of Patent: Nov. 26, 2013

(54) LITHOGRAPHIC APPARATUS, PLASMA SOURCE, AND REFLECTING METHOD

(75) Inventors: Maarten Marinus Johannes Wilhelmus Van Herpen, Heesch (NL); Wouter Anthon Soer, Nijmegan (NL)

(73) Assignee: ASML Netherlands B.V., Veldhoven (NL)

( * ) Notice: Subject to any disclaimer, the term of this patent is extended or adjusted under 35 U.S.C. 154(b) by 437 days.

(21) Appl. No.: 12/920,417

(22) PCT Filed: Mar. 3, 2009

(86) PCT No.: PCT/NL2009/050096
§ 371 (c)(1),
(2), (4) Date: Aug. 31, 2010

(87) PCT Pub. No.: WO2009/110793
PCT Pub. Date: Sep. 11, 2009

(65) Prior Publication Data
US 2011/0007292 A1   Jan. 13, 2011

Related U.S. Application Data

(60) Provisional application No. 61/064,385, filed on Mar. 3, 2008.

(51) Int. Cl.
*G03B 27/42* (2006.01)
*G03B 27/54* (2006.01)
(52) U.S. Cl.
USPC .............................................. 355/67; 355/53
(58) Field of Classification Search
CPC ...... G03F 7/70033; H05G 2/00; H05G 2/001; H05G 2/003; H05G 2/005; H05G 2/008

USPC .................................. 313/567; 355/53, 67, 77
See application file for complete search history.

(56) References Cited

U.S. PATENT DOCUMENTS

| 7,247,870 | B2 | 7/2007 | Ershov et al. ............. 250/504 R |
| 2006/0192152 | A1 | 8/2006 | Ershov et al. ............. 250/503.1 |
| 2006/0261290 | A1 | 11/2006 | Wilhelmus Van Herpen et al. .......................... 250/492.2 |
| 2007/0146659 | A1 | 6/2007 | Klunder et al. .................. 355/30 |
| 2008/0273188 | A1 | 11/2008 | Soer et al. ........................ 355/68 |
| 2008/0291406 | A1 | 11/2008 | Soer et al. ........................ 355/30 |

FOREIGN PATENT DOCUMENTS

| DE | 102006034755 | 1/2008 |
| JP | 55-143502 | 11/1980 |
| WO | WO 2007/051537 | 5/2007 |

OTHER PUBLICATIONS

International Search Report as issued for PCT/NL2009/050096, dated Jun. 29, 2009.
Chinese Office Action dated Dec. 28, 2012 in corresponding Chinese Patent Application No. 200980107377.4.

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

A lithographic apparatus includes a plasma source that includes a vessel configured to enclose a plasma formation site, an optical device configured to transfer optical radiation to or from the vessel, and a reflector arranged in an optical path between the optical device and the plasma formation site source. The reflector is configured to reflect the optical radiation between the optical device and the plasma formation site. The reflector is formed, in operation, as a molten metal mirror.

16 Claims, 4 Drawing Sheets

LITHOGRAPHIC APPARATUS, PLASMA SOURCE, AND REFLECTING METHOD

CROSS-REFERENCE TO RELATED APPLICATIONS

This application claims the benefit of U.S. provisional application 61/064,385, which was filed on Mar. 3, 2008, and which is incorporated herein in its entirety by reference.

FIELD

The present invention relates to a lithographic apparatus, plasma source, and a method for transferring radiation between an optical device and plasma source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Methods to produce extreme ultraviolet (EUV) radiation or light include, but are not necessarily limited to, converting a material into a plasma state that has an element, e.g. xenon, lithium or tin, with an emission line in the EUV range. In one such method, often termed electric discharge produced plasma ("DPP"), the plasma may be produced by an electrical discharge between a pair of electrodes. In another method, the desired plasma can be produced by irradiating a target material, such as a droplet, stream or cluster of material having the associated line-emitting element, with a laser beam. The latter process is referred to as laser produced plasma ("LPP").

For each of these processes, the plasma is typically produced in a sealed vessel, e.g., vacuum chamber, and monitored using various types of metrology equipment. In addition to generating EUV radiation, these plasma processes may also generate undesirable by-products in the plasma chamber, which can include heat, high-energy ions and scattered debris from the plasma formation, e.g., atoms and/or clumps of source material that is not fully ionized in the plasma formation process.

These plasma formation by-products can potentially damage or reduce the operational efficiency of the various plasma chamber optical elements including, but not limited to, the surfaces of metrology detectors, windows used to image the plasma formation process, and in the case of LPP, the laser input window. The heat, high energy ions and/or source material debris may be damaging to the optical elements in a number of ways, including heating them, coating them with materials which reduce light transmission, penetrating into them and, for example, damaging structural integrity and/or optical properties, e.g., the ability of a mirror to reflect light at such short wavelengths, corroding or eroding them and/or diffusing into them.

In addition, some optical elements, e.g., the laser input window, form a part of the vacuum chamber and are thus placed under a stress when a vacuum is present in the plasma chamber. For these elements, deposits and heat can combine to fracture (i.e., crack) the element, thereby resulting in a loss of vacuum and potentially requiring a costly repair.

SUMMARY

It is an aspect of the present invention to protect optics in a plasma source from EUV induced damage and contamination.

According to an aspect of the invention, there is provided a lithographic apparatus comprising a vessel enclosing a plasma source; an optical device for transferring optical radiation to or from the vessel; and a reflector arranged in an optical path between the optical device and the plasma source, for reflecting the optical radiation between the optical device and the plasma source wherein the reflector is formed, in operation, as a molten metal mirror.

According to an aspect of the invention, there is provided a lithographic apparatus that includes a plasma source that includes a vessel configured to enclose a plasma formation site, an optical device configured to transfer optical radiation to or from the vessel, and a reflector arranged in an optical path between the optical device and the plasma formation site source. The reflector is configured to reflect the optical radiation between the optical device and the plasma formation site. The reflector is formed, in operation, as a molten metal mirror. The plasma source may be a laser-produced plasma (LPP) source.

According to an aspect of the invention, there is provided a plasma source that includes a vessel configured to enclose a plasma formation site, an optical device configured to transfer radiation to or from the vessel, and a reflector arranged in an optical path between the optical device and the plasma formation site. The reflector is configured to reflect the radiation between the optical device and the plasma formation site. The reflector is formed, in operation, as a molten metal mirror.

According to an aspect of the invention, there is provided a method for transferring radiation between an optical device and plasma source, the method comprising providing a plasma source enclosed in a vessel; providing an optical device for transferring optical radiation to or from the vessel; and providing a molten metal mirror, arranged in a line of sight of the plasma source, for reflecting the optical radiation to or from the optical device.

According to an aspect of the invention, there is provided a method for transferring radiation between an optical device and a plasma formation site in a plasma source. The method includes enclosing the plasma formation site a vessel, providing optical radiation to or from the vessel with the optical device, and reflecting the optical radiation with a molten metal mirror arranged in a line of sight of the plasma formation site to or from the optical device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
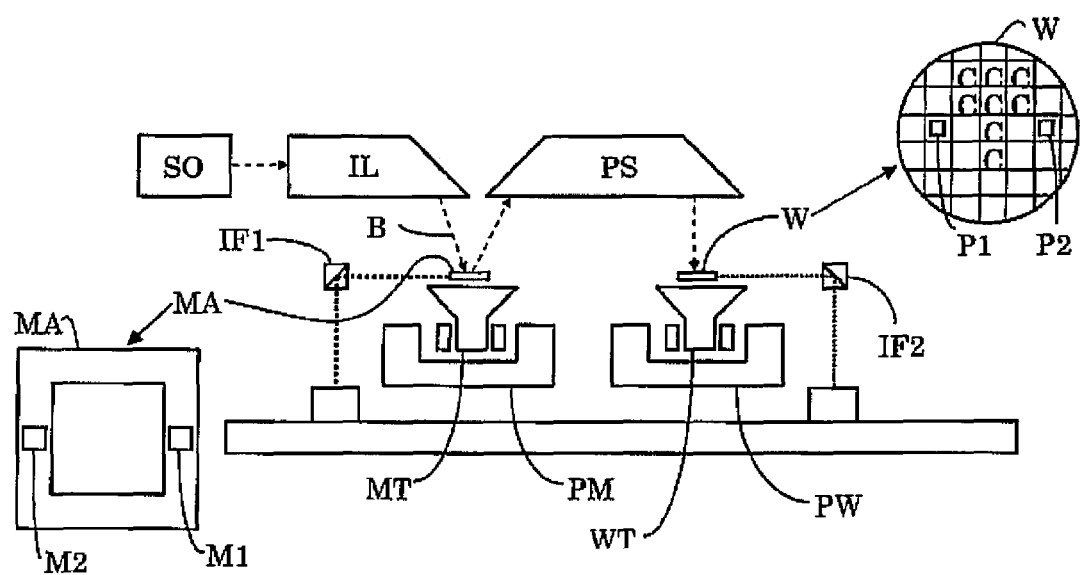
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
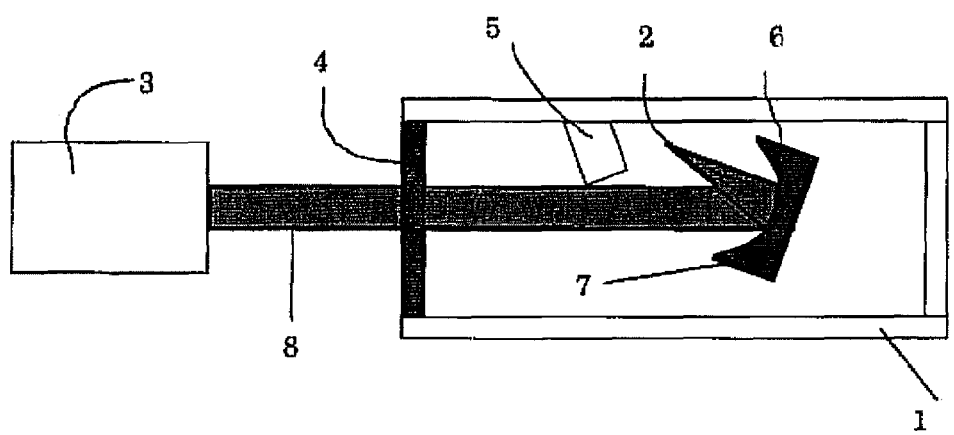
FIG. 2 schematically shows an embodiment of a plasma source of the lithographic apparatus of FIG. 1.

FIG. 2 schematically shows a plasma source that includes a vessel 1 enclosing a plasma formation site 2. The vessel may be a vacuum chamber. The plasma formation site 2 is configured to provide EUV radiation in a lithographic apparatus. As such, the plasma formation site 2 may be considered to be the plasma source itself, because the plasma is formed at the plasma formation site. According to the embodiment of FIG. 2, an optical device 3, which in an embodiment may be a laser device or laser, may used to ignite a plasma. Other optical devices, such as dose sensors, or other optical sensor devices may also be used. The optical device 3 may be a pulsed source, such as described in U.S. Pat. No. 7,247,870. Radiation from or to other optical devices, such as optical sensors, dose meters etc, can be transferred according to embodiments of the invention. The optical device 3 may be provided outside the vessel 1, so that radiation travels through an input window 4 into the vessel 1 (e.g., vacuum chamber). As shown in FIG. 2, a shield 5 is arranged in a line of sight of the plasma formation site 2, and is configured to shield the optical device 3 from debris. In this way, debris, generated during the formation of the plasma at the plasma formation site 2, is unable to hit the input window 4, or, alternatively, hit optics such as lenses mirrors or laser optics relevant for transferring the optical radiation into the vessel.

According to an embodiment, a reflector 6, which may be in the form of a liquid tin (Sn) mirror, is provided to reflect optical radiation 8. The reflector 6 is placed in an optical path between the optical device 3, here depicted as a laser device, and the plasma formation site 2, in particular, a discharge area. The reflector 6 is configured to reflect the optical radiation 8 between the optical device 3 and the plasma formation site 2 (for example a tin (Sn) droplet target). The reflector 6 is provided by a mirror-forming element that has a surface 7. In an embodiment, the surface of the mirror-forming element is curved.

The shield 5 may be provided different from reflector 6, although, in an embodiment, the reflector 6 itself may provide a shielding function, possibly in connection with another optics element.

In the event that the plasma source is a Tin source (alternatives may be Lithium, or Xenon sources), the mirror-forming element of the reflector 6 may have a Molybdenum or Gold surface 7 for having good wetting properties. A potential advantage of this approach is that the mirror forming element provides a focusing lens for the optical radiation 8 that may be placed closer to the plasma formation site 2. Thus, the optical device 3 can be focused more effectively, rendering better plasma generation, reducing laser divergence (when the optical device is a laser) and pointing stability specifications.

In an embodiment, the surface 7 of the reflector 6 is a molten metal surface. A potential advantage of this embodiment is that the reflector 6 can be placed closer due to the cooling properties of the molten metal surface, and due to the relative insensitivity to debris, since the molten metal surface may absorb the debris without problems, in particular, when the metal is functionally equivalent or identical to the debris. In this example, for a Tin source, the molten metal is preferably Tin or more preferably, Tin with additions of Gallium and/or Indium. The latter additions can provide a lower melting point and better wetting properties on Molybdenum or Gold.

In FIG. 2, components such as a fuel droplet generator, cameras and sensors are not shown. In embodiment where the reflector 6 is formed by a liquid Tin surface 7, the reflectivity of the reflector 6 is unaffected by Sn debris contaminating the surface 7. The surface 7 of the reflector 6 may be flat or curved. If a flat surface is used, an additional focusing element may be provided, for example, the input window 4 may be a lens that is used for focusing the light. In that case, the reflector 6 only reflects the light towards the plasma formation site 2. A curved surface, which has focusing power to the optical radiation, may provide an advantage of allowing the focusing lens to be placed closer to the plasma formation site 2, thereby reducing optical radiation (e.g., laser) divergence and pointing stability requirements. To further reduce the distance between the focusing lens and the plasma formation site 2, the surface 7 of reflector may be curved.

Figure 3:
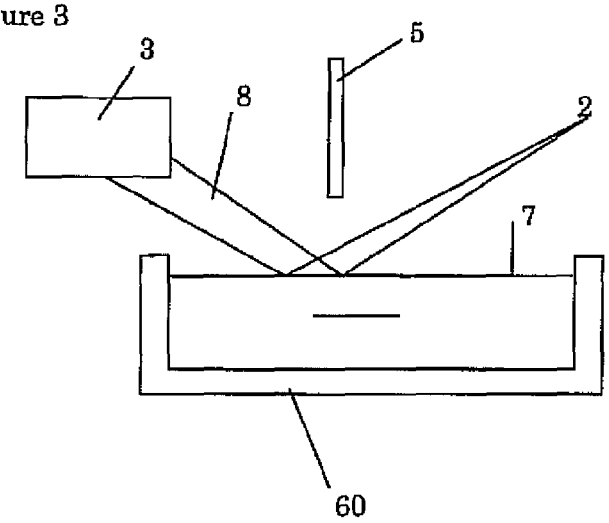
FIG. 3 depicts an embodiment of the plasma source.
Figure 4:
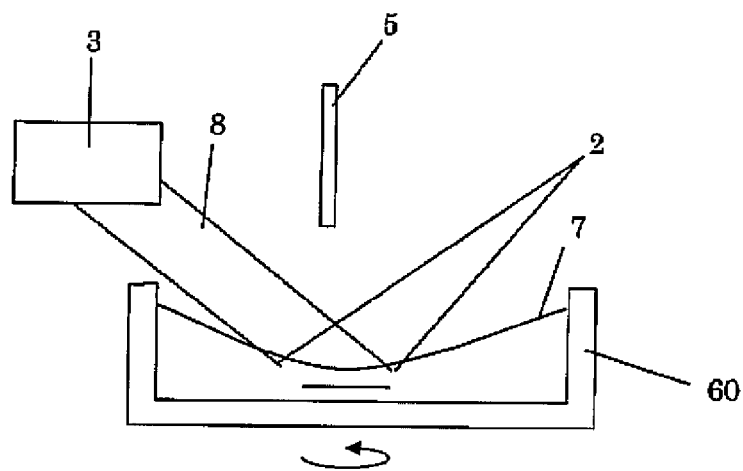
FIG. 4 depicts an embodiment of the plasma source.

In the embodiment of FIG. 3, the plasma formation site 2 is configured such that the reflector 6 is arranged horizontally, in which case the liquid Sn may simply be contained in a bath 60. If the bath 60 is stationary, the surface 7 (comprising Sn) is flat and horizontal due to gravity. Alternatively, as shown in FIG. 4, the bath 60 may be rotated around a vertical axis to create a paraboloid mirror shape which may be used for (further) focusing the laser beam.

Figure 5:
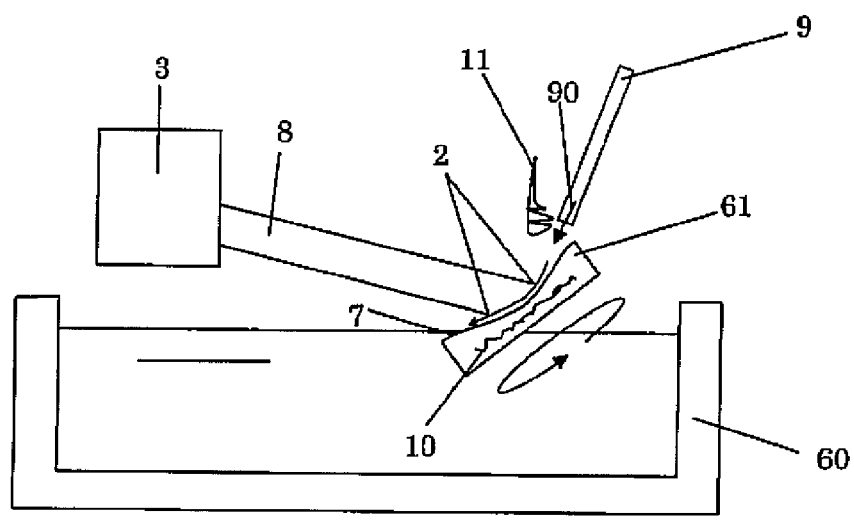
FIG. 5 depicts an embodiment of the plasma source.

In an embodiment, as shown in FIG. 5, the is a liquid Sn film (represented by the surface 7) on a mirror forming element, such as substrate 61, in which case it may be tilted into an arbitrary orientation. In this embodiment, making the surface 7 smoother enhances the reflectivity. In order to achieve this, the Sn surface should have a temperature above the melting point of Sn, and the Sn should have good wetting on the mirror substrate surface. To wet the surface 7, a molten metal supply is provided, by rotating the mirror element 61 through bath 60. Of course, another type of supply is possible, such as providing a flow over surface 7 from an outlet.

Wetting properties of the mirror forming substrate 61 may be influenced by contaminations, in particular, carbon contaminations and oxides on the mirror forming surface. These contaminations and oxides can be removed by heating the substrate under hydrogen atmosphere.

As shown in FIG. 5, the embodiment also includes an additional inlet 9 for hydrogen gas 90, and a heater 10. When the mirror needs to become smoother (for example before turning on the EUV (plasma) source, or when during operation the efficiency goes down), hydrogen gas 90 may be fed into the system and the heater 10 may be switched on. This will heat the mirror substrate 61 under hydrogen atmosphere, removing contamination and oxides from its surface. Subsequently, the hydrogen gas 90 and heater 10 can be turned off, after which the EUV (plasma) source can be operated. Any Sn that now covers the surface will have good wetting, and thus it will form a highly (IR) reflective coating.

In an embodiment, the heater may remain switched on, in order to heat the mirror to its desired operating temperature (which should be above the melting temperature of Sn).

It should be noted that it might also be possible to prevent contaminations and oxides by choosing the right material for the substrate 61. For example, one may choose to use a material that has a very low oxidation rate (for example Au).

One possible disadvantage of heating under hydrogen is that the removal of contamination and oxides is relatively slow, and that the mirror may need to be heated to very high temperature.

A method that may be faster and work at a lower temperature is the use of hydrogen radicals instead of molecules. This embodiment may further comprise a means for generating hydrogen radicals from the hydrogen 90. This may, for example, be a hot filament 11 or an RF discharge. Note that heater 10 may now not be used anymore, but it can still be used to control the operating temperature of the collector during EUV illumination.

Figure 6:
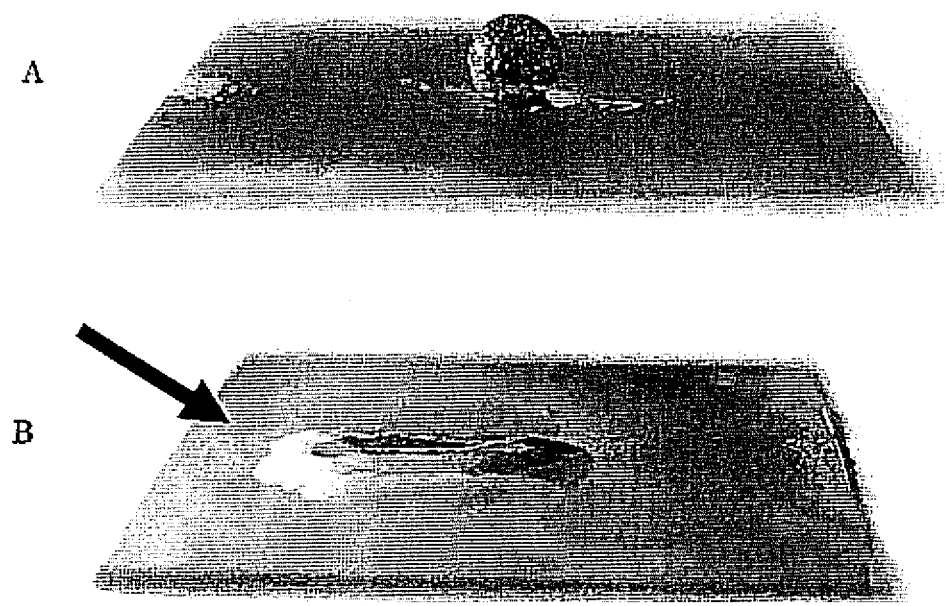
FIG. 6 depicts a practical illustration of shield according to an embodiment of the plasma source.

FIG. 6 shows the effect of a treatment with hydrogen radicals on the wetting of pure Sn on a Mo platelet. The top image FIG. 6A shows a Mo platelet with a Sn droplet, which has been heated to the Sn melting point under $N_2$ environment. The bottom picture FIG. 6B shows the same experiment, but then under a $H_2/H$ environment. The result shows that the H treatment results in good wetting of Sn on Mo. In both experiments a hot filament was used for heating. In some cases pure Sn can be used, but preferably a Ga—In—Sn alloy is used. This alloy has a wetting behavior similar to Sn, but it has the advantage of being liquid at room temperature. When using Ga—In—Sn, preferably an argon environment is used to prevent the Ga in the alloy from oxidizing.

As can be seen in the Figures, the reflector is the last optical element in the optical path in the direction downstream from the optical device to the plasma formation site.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An apparatus comprising:
   a plasma source comprising
      a vessel configured to enclose a plasma formation site;

an optical device configured to transfer optical radiation to or from the vessel;

a shield arranged between the optical device and the plasma formation site in a line of sight of the plasma formation site from the optical device, the shield being configured to shield the optical device from debris; and a reflector arranged in an optical path between the optical device and the plasma formation site, the reflector being configured to reflect the optical radiation between the optical device and the plasma formation site, wherein the reflector comprises a molten metal mirror.

2. An apparatus according to claim 1, wherein the molten metal mirror comprises a Tin melt.

3. An apparatus according to claim 1, wherein the plasma formation site comprises Tin or Lithium.

4. An apparatus according to claim 1, wherein the optical device is a laser device configured to produce plasma in a discharge area of the plasma formation site.

5. An apparatus according to claim 1, wherein the mirror comprises a mirror forming element, and wherein a molten metal supply is provided to wet the mirror forming element.

6. An apparatus according to claim 5, wherein the mirror forming element is arranged in a bath of the molten metal supply at a slant angle relative to the direction of gravity.

7. An apparatus according to claim 5, the mirror forming element in a bath of the molten metal supply so as to wet the mirror forming element with molten metal.

8. An apparatus according to claim 5, wherein the mirror forming element is curved to provide focusing power to the optical radiation.

9. An apparatus according to claim 5, wherein the mirror forming element has a surface layer comprising gold or molybdenum.

10. A lithographic apparatus according to claim 1, wherein the reflector is the last optical element in the optical path in a direction downstream from the optical device to the plasma formation site.

11. A lithographic apparatus according to claim 1, further comprising a heater configured to heat the molten metal mirror to a temperature above the melting temperature of metal in the molten metal mirror.

12. A plasma source comprising:

a vessel configured to enclose a plasma formation site;

an optical device configured to transfer radiation to or from the vessel;

a shield arranged between the optical device and the plasma formation site in a line of sight of the plasma formation site from the optical device, the shield being configured to shield the optical device from debris; and a reflector arranged in an optical path between the optical device and the plasma formation site, the reflector being configured to reflect the radiation between the optical device and the plasma formation site, wherein the reflector comprises a molten metal mirror.

13. A plasma source according to claim 12, wherein the reflector is the last optical element in the optical path in a direction downstream from the optical device to the plasma formation site.

14. A lithographic apparatus comprising:

a plasma source configured to generate radiation, the plasma source comprising a vessel configured to enclose a plasma formation site, an optical device configured to transfer optical radiation to or from the vessel, a shield arranged between the optical device and the plasma formation site in a line of sight of the plasma formation site from the optical device, the shield being configured to shield the optical device from debris, and a reflector arranged in an optical path between the optical device and the plasma formation site, the reflector being configured to reflect the optical radiation between the optical device and the plasma formation site, wherein the reflector comprises a molten metal mirror;

an illuminator configured to condition the radiation;

a patterning device configured to pattern the radiation; and a projection system configured to project the patterned radiation onto a substrate.

15. A lithographic apparatus according to claim 14, wherein the reflector is the last optical element in the optical path in a direction downstream from the optical device to the plasma formation site.

16. A lithographic apparatus according to claim 14, further comprising a heater configured to heat the molten metal mirror to a temperature above the melting temperature of metal in the molten metal mirror.

\* \* \* \* \*

UNITED STATES PATENT AND TRADEMARK OFFICE
CERTIFICATE OF CORRECTION

| | |
|---|---|
| PATENT NO. | : 8,593,617 B2 |
| APPLICATION NO. | : 12/920417 |
| DATED | : November 26, 2013 |
| INVENTOR(S) | : Maarten Marinus Johannes Wilhelmus Van Herpen et al. |

Page 1 of 1

It is certified that error appears in the above-identified patent and that said Letters Patent is hereby corrected as shown below:

On title page, Item (75) Inventors replace "Nijmegan"
with --Nijmegen--.

Signed and Sealed this
Twenty-fifth Day of February, 2014

Michelle K. Lee
*Deputy Director of the United States Patent and Trademark Office*